United States Patent
Lin et al.

(10) Patent No.: US 9,991,775 B1
(45) Date of Patent: Jun. 5, 2018

(54) CONSTANT ON-TIME CONVERTER HAVING FAST TRANSIENT RESPONSE

(71) Applicant: ANPEC ELECTRONICS CORPORATION, Hsinchu (TW)

(72) Inventors: Hsin-Tai Lin, Taichung (TW); Chih-Yuan Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days. days.

(21) Appl. No.: 15/612,531

(22) Filed: Jun. 2, 2017

(30) Foreign Application Priority Data

Jan. 6, 2017 (TW) .............................. 106100457 A

(51) Int. Cl.
- *H02M 3/158* (2006.01)
- *H02M 3/156* (2006.01)
- *H02M 1/00* (2006.01)
- *H03H 7/06* (2006.01)
- *H02M 5/293* (2006.01)

(52) U.S. Cl.
CPC .............. *H02M 1/00* (2013.01); *H02M 5/293* (2013.01); *H03H 7/06* (2013.01); *H02M 2001/0003* (2013.01); *H02M 2005/2932* (2013.01)

(58) Field of Classification Search
CPC ............... H02M 3/158; H02M 3/1588; H02M 2003/1566; H02M 3/156
See application file for complete search history.

(56) References Cited

U.S. PATENT DOCUMENTS

| | | | | |
|---|---|---|---|---|
| 7,508,181 B2 * | 3/2009 | Chen | ...................... | H02M 3/156 323/266 |
| 7,932,709 B1 * | 4/2011 | Ling | ...................... | H02M 3/156 323/285 |
| 9,356,510 B2 * | 5/2016 | Jiang | ...................... | H02M 3/156 |
| 9,379,607 B2 * | 6/2016 | Chiu | ...................... | H02M 3/156 |
| 9,667,146 B1 * | 5/2017 | Goenawan | ............ | H02M 3/158 |
| 2007/0139027 A1 * | 6/2007 | Nishimori | ............. | H02M 3/158 323/283 |
| 2011/0215780 A1 * | 9/2011 | Lee | ........................... | G05F 1/10 323/282 |
| 2015/0177756 A1 * | 6/2015 | Yuan | ........................ | G05F 1/56 323/271 |
| 2016/0105111 A1 * | 4/2016 | Yang | .................... | H02M 3/1563 323/271 |
| 2017/0025952 A1 * | 1/2017 | Huang | .................. | H02M 3/156 |
| 2017/0085168 A1 * | 3/2017 | Laur | ...................... | H02M 3/158 |
| 2017/0373596 A1 * | 12/2017 | Huang | .................. | H02M 3/158 |

\* cited by examiner

*Primary Examiner* — Timothy J Dole
*Assistant Examiner* — Sisay G Tiku
(74) *Attorney, Agent, or Firm* — Li & Cai Intellectual Property (USA) Office

(57) ABSTRACT

The present disclosure provides a constant on-time converter having fast transient response, which adaptively adjusts an on-time and an off-time by a first compensation circuit and a second compensation circuit, to accordingly adjust an inductive current. When a load converts a light loading into a heavy loading, the constant on-time converter adaptively adjusts the on-time of the clock signal. When the load converts a heavy loading into a light loading, the constant on-time converter adaptively adjusts the off-time of the clock signal. Therefore, the output voltage can be adjusted rapidly in response to different load changes to enhance the transient response of the output voltage.

12 Claims, 7 Drawing Sheets

CONSTANT ON-TIME CONVERTER HAVING FAST TRANSIENT RESPONSE

BACKGROUND

1. Technical Field

The present disclosure relates to a constant on-time converter, in particular, to a constant on-time converter having fast transient response.

2. Description of Related Art

For the power management in a system, constant on-time converters are often used to provide different levels of operating voltage. A better constant on-time converter is capable of providing a stable output voltage and a wide range output current. When the load changes instantaneously, the output voltage can still be stabilized at the original voltage level and quickly provides the corresponding load current, thereby efficiently converting the voltage.

Reference is made to FIG. 1 which shows the diagram of a traditional constant on-time converter. The constant on-time converter 10 is used for converting the input voltage VIN into the output voltage VOUT to drive a load (representing by the capacitor Cp). The constant on-time converter 10 includes a switch circuit 12, a feedback circuit 14, a pulse width modulation (PWM) controller 16, and a driving circuit 18. The switch circuit 12 includes a high-side switch Sup and a low-side switch Sdn. The high-side switch Sup which is turned on provides a charge path to an inductor L. The low-side switch Sdn which is turned on provides a discharge path to the inductor L. The feedback circuit 14 is used for detecting the variation of the output voltage VOUT. More specifically, the feedback circuit 14 divides the output voltage VOUT by two series resistors A1 and A2 to generate the corresponding feedback voltage VFB to a decision circuit 16A of the PWM controller 16.

The decision circuit 16A generates a switch signal SW to a clock generator 16B of the PWM controller 16. The clock generator 16B generates the clock signal CLK with the constant on-time to the driving circuit 18 according to the switch signal SW. The driving circuit 18 controls the high-side switch Sup and the low-side switch Sdn according to the clock signal CLK to charge or discharge the inductor L. Therefore, the driving circuit 18 generates the necessary load current and the stable output voltage VOUT.

However, in the architecture of the traditional constant on-time converter 10, the clock signal CLK with the constant on-time is a periodic oscillation signal. It usually needs to have a minimum off-time for over current protection. Therefore, when the load is instantaneously converted from light load to heavy load (e.g., the load current is converted from 1A to 6A), the clock generator 16 generates the clock signal CLK having the minimum period, causing an excessive decrease in the output voltage VOUT to reduce the transient response of the output voltage VOUT.

Reference is made to FIG. 2 which shows the diagram of the load of the current mode voltage converter being converted from light load to heavy load. As shown in FIG. 2, at time point T1, the load is converted from the light load to the heavy load. At this time, the feedback circuit 14 detects the variation of the output voltage VOUT, and the clock generator 16B generates the clock signal CLK having the minimum period to rapidly increase the current flowing through the inductor L. During time points T1-T2, the output voltage VOUT has an excessive decrease because the clock signal CLK needs to have the minimum off-time. After that, the driving circuit 18 gradually stabilizes the output voltage VOUT to a voltage level in the subsequent clock signals (e.g., the clock signals of the time point T3).

Similarly, reference is made to FIG. 3 which shows the diagram of the load of the current mode voltage converter being converted from heavy load to light load. When the load is instantaneously converted from heavy load to light load (e.g., the load current is converted from 6A to 1A), the clock generator 16 generates the longer off-time to rapidly reduce the output voltage VOUT. More specifically, as shown in FIG. 3, at time point T4, the load is converted from the heavy load to the light load. At this time, the feedback circuit 14 detects the variation of the output voltage VOUT. The clock generator 16 generates the longer off-time to rapidly reduce the current flowing through the inductor L. The driving circuit 18 gradually stabilizes the output voltage VOUT to a voltage level in the subsequent clock signals (e.g., the clock signals of the time point T5). Therefore, in the architecture of the conventional constant on-time converter 10, the transient response of the output voltage VOUT does not reduce.

As mentioned above, when the load is instantaneously converted from light load to heavy load, the output voltage VOUT of the conventional constant on-time has the worse transient response.

SUMMARY

Accordingly, exemplary embodiments of the present disclosure provide a constant on-time converter having fast transient response. When the load is instantaneously converted from light load to heavy load or is converted from heavy load to light load, the constant on-time converter can adaptively adjust the on-time of the clock signal, thereby enhancing the transient response of the output voltage for the different load changes in the continuous time.

An exemplary embodiment of the present disclosure provides a constant on-time converter having fast transient response. The constant on-time converter comprises an output-stage, a first compensation circuit, a second compensation circuit, and an on-time generator. The output-stage circuit is configured for outputting an output voltage according to an inductive current. The output-stage circuit is configured for generating a feedback voltage according to the output voltage. The first compensation circuit is coupled to the output-stage circuit. The first compensation circuit is configured for generating a first AC signal according to the feedback voltage and a reference voltage. The first compensation circuit generates a first DC signal according to the first AC signal and compares the first AC signal with the first DC signal to generate a set signal. The second compensation circuit is coupled to the first compensation circuit. The second compensation circuit is configured for receiving the first AC signal and generating a second AC signal and a second DC signal according to the first AC signal. The second AC signal is related to an AC value of the first AC signal and the second DC signal is related to a DC value of the first AC signal. The on-time generator is coupled between the first compensation circuit and the second compensation circuit. The on-time generator is configured for generating an on-time of a clock signal to the output-stage circuit according to the set signal, the second AC signal, and the second DC signal. When the second AC signal is less than or equal to the second DC signal, the on-time generator increases the on-time of the clock signal and the output-stage circuit adjusts the inductive current according to the on-time. When the second AC signal is more than the second DC signal, the on-time generator decreases the on-time of the clock signal to increase an off-time of the clock signal and the output-stage circuit adjusts the inductive current according to the off-time.

To sum up, the present disclosure provides a constant on-time converter having fast transient response which adaptively adjusts the on-time of the clock signal by using the first compensation circuit and the second compensation circuit to accordingly adjust the inductive current, thereby enhancing the transient response of the output voltage.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
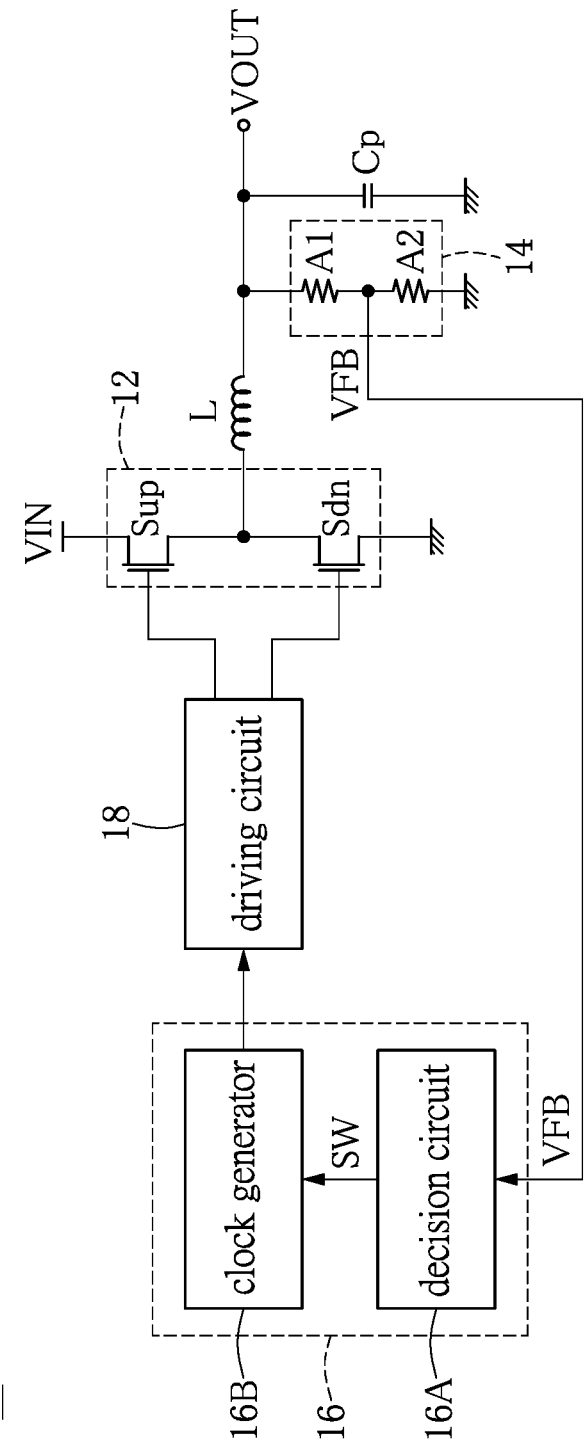
FIG. 1 shows a diagram of a conventional constant on-time converter.
Figure 2:
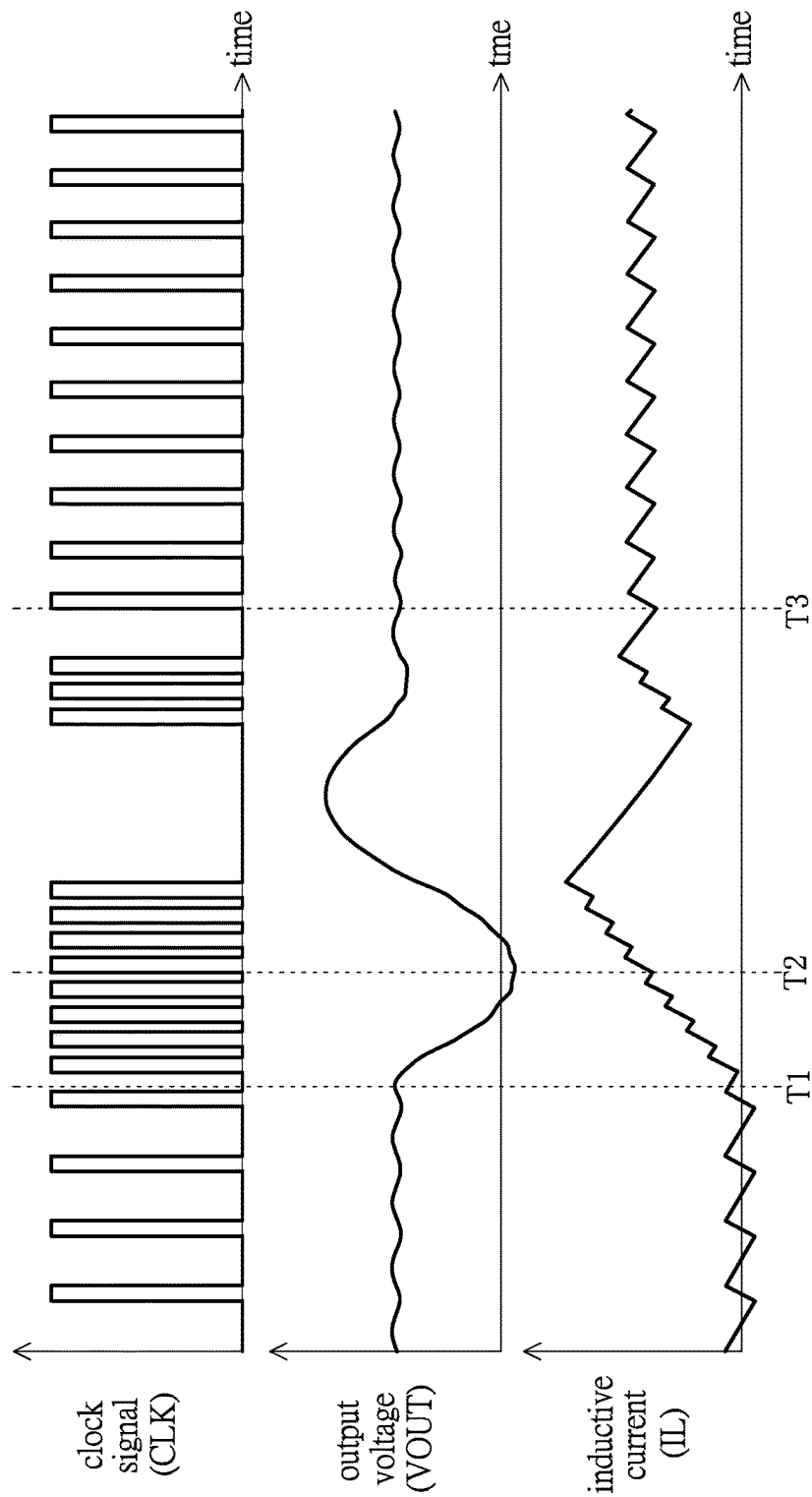
FIG. 2 shows a diagram of the load of the conventional constant on-time converter being converted from light load to heavy load.
Figure 3:
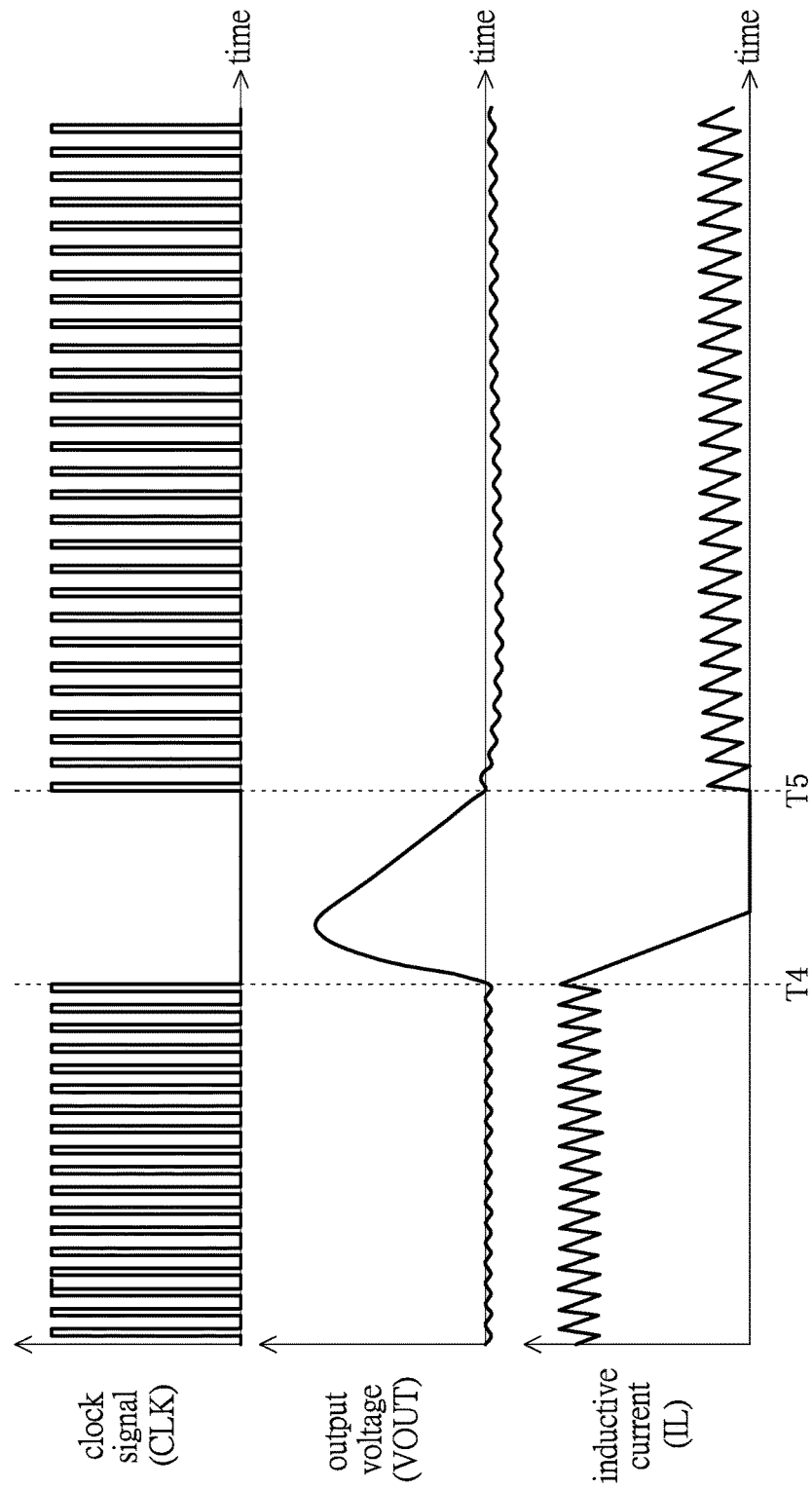
FIG. 3 shows a diagram of the load of the conventional constant on-time converter being converted from heavy load to light load.

Reference will now be made in detail to the exemplary embodiments of the present disclosure, examples of which are illustrated in the accompanying drawings. Wherever possible, the same reference numbers are used in the drawings and the description to refer to the same or like parts.

The present disclosure provides a constant on-time converter having fast transient response which adaptively adjusts the on-time of the clock signal by using the first compensation circuit and the second compensation circuit to accordingly adjust an inductive current. When the load is converted from light load to heavy load, the constant on-time converter adaptively increases the on-time of the clock signal. When the load is converted from heavy load to light load, the constant on-time converter adaptively decreases the on-time of the clock signal. Therefore, the output voltage can be adjusted rapidly in response to different load changes to enhance the transient response of the output voltage. The constant on-time converter having fast transient response provided in the exemplary embodiment of the present disclosure will be described in the following paragraph.

Figure 4:
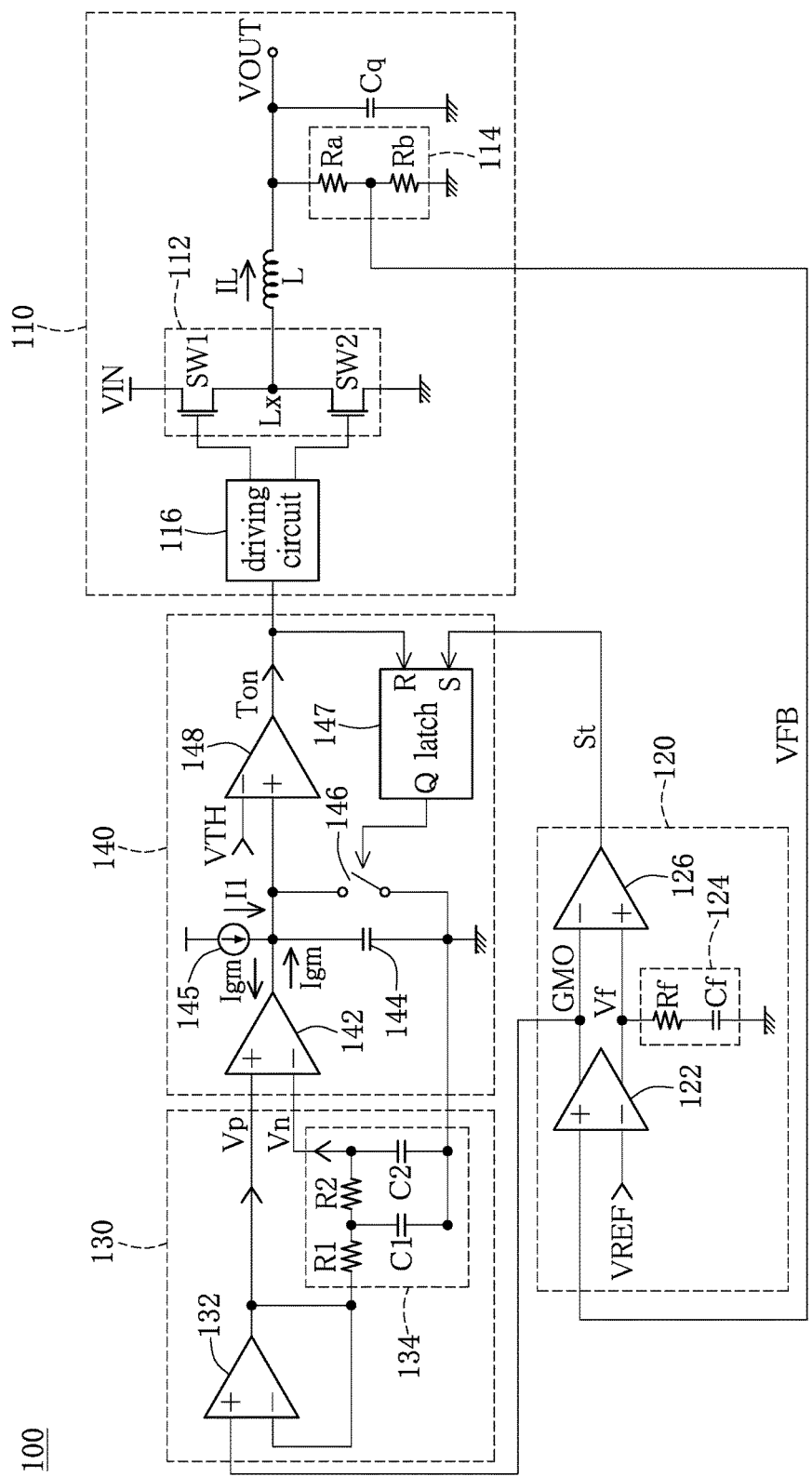
FIG. 4 shows a diagram of a constant on-time converter according to an embodiment of the present disclosure.

Referring to FIG. 4 which shows a diagram of a constant on-time converter according to an embodiment of the present disclosure. As shown in FIG. 4, a constant on-time converter 100 having fast transient response is used for converting an input voltage VIN into an output voltage VOUT to drive a load (representing by the capacitor Cq). The constant on-time converter 100 includes an output-stage circuit 110, a first compensation circuit 120, a second compensation circuit 130, and an on-time generator 140. The output-stage circuit 110 outputs the output voltage VOUT according to an inductive current IL to convert the input voltage VIN into the output voltage VOUT. The output-stage circuit 110 generates a feedback voltage VFB related to the output voltage VOUT according to the output voltage VOUT to enable the first compensation circuit 120 to execute subsequent processes.

More specifically, the output-stage circuit 110 includes a switch circuit 112, an inductor L, a feedback circuit 114, and a driving circuit 116. The switch circuit 112 has a high-side switch SW1 and a low-side switch SW2. An end of the high-side switch SW1 receives the input voltage VIN and the other end of the high-side switch SW1 connects to a ground by the low-side switch SW2. A connection end Lx is provided between the high-side switch SW1 and the low-side switch SW2. The inductor L is coupled to the connection end Lx and generates the output voltage VOUT according to the inductive current IL. The feedback circuit 114 is coupled to the inductor L and generates the feedback voltage VFB according to the output voltage VOUT. In the present embodiment, the feedback circuit 114 divides the output voltage VOUT by two series resistors Ra and Rb to generate the corresponding feedback voltage VFB to the first compensation circuit 120.

The driving circuit 116 is coupled between the on-time generator 140 and the switch circuit 112. The driving circuit 116 controls the turn-on and turn-off of the high-side switch SW1 and the turn-on and turn-off of the low-side switch SW2 according to an on-time of a clock signal CLK to adjust the inductive current IL flowing through the high-side switch SW1 and the low-side switch SW2. The generation of the on-time of the clock signal CLK will be described in the following embodiments and unnecessary descriptions are therefore omitted.

When the on-time Ton is at a first level (i.e., the high level in the present disclosure), the driving circuit 116 turns on the high-side switch SW1 and turns off the low-side switch SW2. When the on-time Ton is at a second level (i.e., the low level in the present disclosure), the driving circuit 116 turns off the high-side switch SW1 and turns on the low-side switch SW2. Those skilled in the art would know that the driving circuit 116 turns on the high-side switch SW1 and turns off the low-side switch SW2 to increase the inductive current IL flowing through the inductor L, and the driving circuit 116 turns off the high-side switch SW1 and turns on the low-side switch SW2 to decrease the inductive current IL flowing through the inductor L, so detailed description is omitted.

Returning to FIG. 4, the first compensation circuit 120 is coupled to the output-stage circuit 110 and generates a first AC signal GMO according to the feedback voltage VFB and a reference voltage VREF. The first compensation circuit 120 generates a first DC signal Vf according to the first AC signal GMO and compares the first AC signal GMO with the first DC signal Vf to generate a set signal St, thereby triggering the on-time Ton of the clock signal.

The first compensation circuit 120 includes a first amplifier 122, a first filter 124, and a comparator 126. The first amplifier 122 receives the feedback voltage VFB and the reference voltage VREF. The first amplifier 122 generates the first AC signal GMO according to the feedback voltage VFB and the reference voltage VREF. The first filter 124 is coupled between the first amplifier 122 and the comparator 126. The first filter 124 generates the first DC signal VF according to the first AC signal GMO, to adjust the bandwidth of the system circuit to stabilize the system loop. The comparator 126 is coupled between the first filter 124 and the on-time generator 140. The comparator 126 compares the first AC signal GMO with the first DC signal Vf to generate the set signal St. Therefore, when the feedback voltage VFB is less than or equal to the reference voltage VREF, the comparator 126 generates the set signal St with the first level (i.e., the high level in the present disclosure) to the on-time generator 140. The on-time generator 140 generates the on-time Ton of the clock signal according to the set signal St with the first level to the output-stage circuit 110. Conversely, when the feedback voltage VFB is more than the reference voltage VREF, the comparator 126 generates the set signal St with the second level (i.e., the low level in the present disclosure) to the on-time generator 140. The on-time generator 140 does not operate according to the set signal St with the second level.

In the present disclosure, the first amplifier 122 is a gain amplifier. The negative end of the gain amplifier receives the reference voltage VREF. The positive end of the gain amplifier receives the feedback voltage VFB. The output end of the gain amplifier transmits the first AC signal GMO to the negative end of the comparator 126. The positive end of the comparator 126 receives the first DC signal Vf and the output end of the comparator 126 transmits the set signal St to the on-time generator 140. The first filter 124 is an RC filter, which has a resistor Rf and a comparator Cf. An end of the resistor Rf is connected between the first amplifier 122 and the comparator 126 and the other end of the resistor Rf connects the capacitor Cf in series to ground. The first filter 124 is also composed of the resistors and the capacitors to be the RC filter. The present disclosure is not limited thereto.

Returning to FIG. 4, the second compensation circuit 130 is coupled to the first compensation circuit 120. The second compensation circuit 130 receives the first AC signal GMO and generates a second AC signal Vp and a second DC signal Vn according to the first AC signal GMO. The second AC signal Vp is related to an AC value of the first AC signal GMO. The second DC signal Vn is related to a DC value of the first AC signal GMO.

More specifically, the second compensation circuit 130 includes a second amplifier 132 and a second filter 134. The second amplifier 132 has a positive end, a negative end, and an output end. The positive end of the second amplifier 132 receives the first AC signal GMO. The output end of the second amplifier 132 is coupled to the negative end and generates the second AC signal Vp according to the first AC signal GMO. In the present disclosure, the second amplifier 132 is a unit gain amplifier, which is used as a voltage isolation to prevent the second filter element 134 from influencing the first AC signal GMO.

The second filter 134 is coupled to the output end and generates the second DC signal Vn according to the second AC signal Vp. In the present disclosure, the second filter 134 is an RC filter and includes a first resistor R1, a second resistor R2, a first capacitor C1, and a second capacitor C2. The first resistor R1 is electrically connected to the negative end and the output end of the second amplifier 132. The second resistor R2 is connected between the first resistor R1 and the on-time generator 140 in series. The first capacitor C1 is electrically connected an end between the first resistor R1 and the second resistor R2. The second capacitor C2 is electrically connected an end between the second resistor R2 and the on-time generator 140. Therefore, the second filter 134 filters the AC value of the first AC signal GMO to generate the second DC signal Vn indicating the DC value of the first AC signal GMO. The RC filter can be composed of a plurality of resistors and a plurality of capacitors. The present disclosure is not limited thereto.

It is worth to note that the first AC signal GMO generated from the first compensation circuit 120 is used for controlling the on-time generator 140 to trigger the on-time Ton of the clock signal. The second AC signal Vp and the second DC signal Vn generated from the second compensation circuit 130 is used for controlling the time length of the on-time Ton. The values of the second AC signal Vp and the first AC signal GMO can be disposed by the actual architecture of the constant on-time converter 100 and would not be limited to the exemplary embodiments provided by the present disclosure.

The on-time generator 140 is coupled between the first compensation circuit 120 and the second compensation circuit 130. The on-time generator 140 generates an on-time Ton to the output-stage circuit 110 according to the set signal St, the second AC signal Vp and the second DC signal Vn, so that the output-stage circuit 110 adjusts the inductive current IL according to the on-time Ton. When the second AC signal Vp is less than or equal to the second DC signal Vn, it indicates that the inductive current IL needs to increase immediately. At this time, the on-time generator 140 increases the on-time Ton of the clock signal to adjust the inductive current IL. When the second AC signal Vp is more than the second DC signal Vn, it indicates that the inductive current IL needs to decrease immediately. At this time, the on-time generator 140 decreases the on-time Ton of the clock signal to increase the off-time of the clock signal, thereby adjusting the inductive current IL.

More specifically, the on-time generator 140 includes a transconductance amplifier 142, a clock capacitor 144, a clock switch 146, a latch 147, and a clock comparator 148. The transconductance amplifier 142 has a first end, a second end, and a transconductance output end. The first end of the transconductance amplifier 142 receives the second AC signal Vp. The second end of the transconductance amplifer 142 receives the second DC signal Vn. The transconductance amplifier 142 generates a transconductance current Igm according to the AC signal Vac and the DC signal Vdc, to charge or discharge the clock capacitor 144. An end of the clock capacitor 144 is coupled to the transconductance output end and a current source 145and the other end of the clock capacitor 144 is coupled to ground. An end of the clock switch 146 is coupled to the transconductance output end and the other end of the clock switch 146 is coupled to ground. The latch 147 is coupled between the clock switch 146 and the clock comparator 148. The latch 147 turns on or turns off the clock switch 146 according to the set signal St and the on-time Ton. In the present disclosure, the latch 147 is SR flip-flop, and the SR flip-flop has a set end S, a reset R, and an output end Q. The set end S is coupled to the comparator 126 and the reset end R is coupled to transconductance output end of the clock comparator 148. The output end Q is coupled to the clock switch 146 to control the turn-on and turn-off of the clock switch 146. The clock comparator 148 is coupled to the transconductance output end and receives the transconductance current Igm and a current source current I1 generated from the current source 145. The clock comparator 148 compares a current relationship between the current source current I1 and the transconductance current Igm with a threshold voltage VTH to generate the on-time Ton to the driving circuit 116. In the present disclosure, the negative end of the clock comparator 148 receives the threshold voltage VTH. The positive end of the clock comparator 148 receives the current relationship between the current source current I1 and the transconductance current Igm. The output end of the clock comparator 148 outputs the on-time Ton to the driving circuit 116.

Therefore, when the second AC signal Vp is less than or equal to the second DC signal Vn (indicating that the inductive current IL needs to increase immediately), the on-time Ton increases, so that the latch 147 delays to turn on the clock switch 146. The clock capacitor 144 receives the difference of the current source current I1 and the transconductance current Igm to extend the charging time of the clock capacitor 144, thereby increasing the time length of the on-time Ton of the clock signal. Conversely, when the second AC signal Vp is more than the second DC signal Vn (indicating that the inductive current IL needs to decrease immediately), the on-time Ton decreases, so that the latch 147 early turns on the clock switch 146. The clock capacitor 144 receives a sum of the current source current I1 and the transconductance current Igm to shorten the charging time of the clock capacitor 144, thereby increasing the time length of the off-time of the clock signal (i.e., not generating the on-time Ton). The output-stage circuit 110 adjusts the inductive current IL according to the on-time Ton of the clock signal.

From the aforementioned exemplary embodiments, the constant on-time converter 100 of the present disclosure adaptively adjusts the on-time of the clock signal by using the first compensation circuit 120 and the second compensation circuit 130 to accordingly adjust the inductive current L, thereby enhancing the transient response of the output voltage VOUT.

Figure 5:
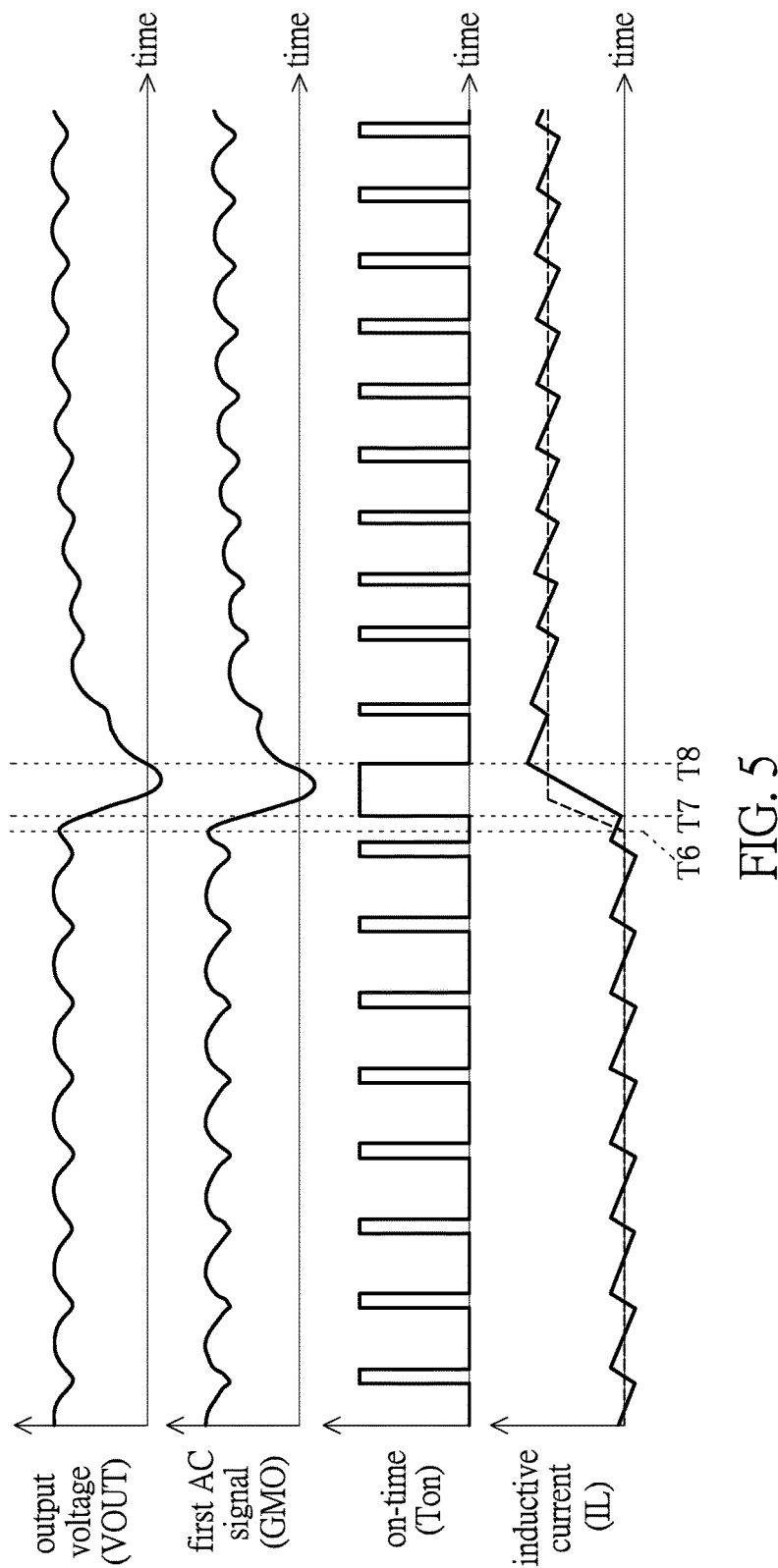
FIG. 5 shows a waveform of the load of the constant on-time converter being converted from light load to heavy load according to an embodiment of the present disclosure.

The following description is based on the example that the load is converted from light load to heavy load. Reference is made to FIG. 5 which shows the waveform of the load of the constant on-time converter being converted from light load to heavy load according to an embodiment of the present disclosure. As shown in FIG. 5A, at time point T6, the load is converted from the light load to the heavy load immediately. At this time, the output voltage VOUT decreases, resulting in a decrease in the first AC signal GMO. In addition, the first AC signal Vp is less than or equal to the second DC signal Vn. At this time, the clock capacitor 144 receives the difference value between the current source current I1 and the transconductance current Igm (i.e., I1-Igm). Therefore, at time point T7, the on-time generator 140 increases the on-time Ton of the clock signal CLK to rapidly increase the inductive current IL, thereby avoiding the output voltage VOUT having an excessive decrease. After time point T8, the output voltage VOUT is stabilized to a voltage level gradually.

With respect to the implementation of the load being converted from heavy load to light load, it is inferred from the implementation in FIG. 5 and the present disclosure is not limited thereto. When the load is converted from the heavy load to the light load immediately, the output voltage VOUT increases, resulting in an increase in the first AC signal GMO. In addition, the first AC signal Vp is more than the second DC signal Vn. At this time, the clock capacitor 144 receives the sum of the current source current I1 and the transconductance current Igm (i.e., I1+Igm). Therefore, the on-time generator 140 increases the off-time of the clock signal CLK (i.e., shortening the on-time Ton) to rapidly decrease the inductive current IL, thereby avoiding the output voltage VOUT having an excessive increase. Next, the output voltage VOUT is stabilized to a voltage level gradually.

Figure 6:
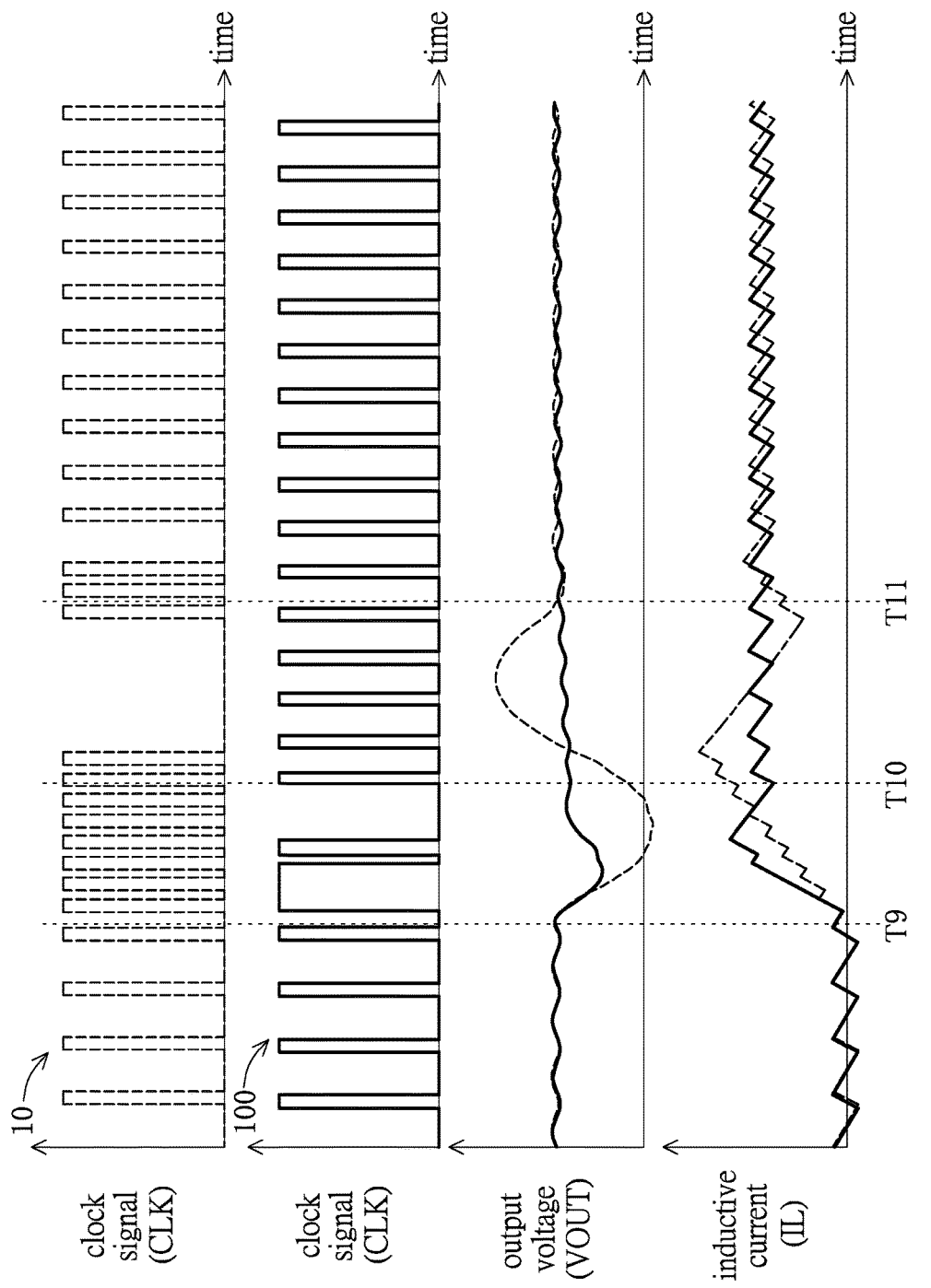
FIG. 6 shows a diagram of comparing the conventional constant on-time converter with the constant on-time converter of the present disclosure.

On condition that the load is converted from the light load to the heavy load, the comparison of the traditional constant on-time converter 10 (the dotted line) and the constant on-time converter 100 of the present disclosure (the active line) will be described in the following paragraph. As shown in FIG. 6, at time point T9, the load is converted from the light load to the heavy load. Because the clock signal CLK of the traditional constant on-time converter 10 is a constant frequency, the traditional output voltage VOUT has more decreases than the output voltage VOUT of the present disclosure has. The time of the traditional output voltage VOUT stabilizing to a voltage level (i.e., the time points T9-T11) is higher than the time of the output voltage VOUT of the present disclosure stabilizing to a voltage level (i.e., the time points T9-T10). Therefore, when the load is converted from the light load to the heavy load, the transient response of the output voltage VOUT is enhanced by using the constant on-time converter 100. In addition, when the traditional constant on-time converter 10 wants to stop generating the on-time Ton, it is necessary to wait until the feedback voltage VFB is higher than the reference voltage VREF, so that the inductor current IL is excessively high and the output voltage VOUT has an excessive increase. However, the constant on-time converter 100 can quickly increase the on-time Ton by the second compensation circuit 130 and does not need to wait until the feedback voltage VFB is higher than the reference voltage VREF to stop generating the on-time Ton. When the second AC signal Vp is higher than the second DC signal Vn, the constant on-time converter 100 stops generating the on-time Ton. Therefore, the output voltage VOUT of the present disclosure has better transient response.

Figure 7:
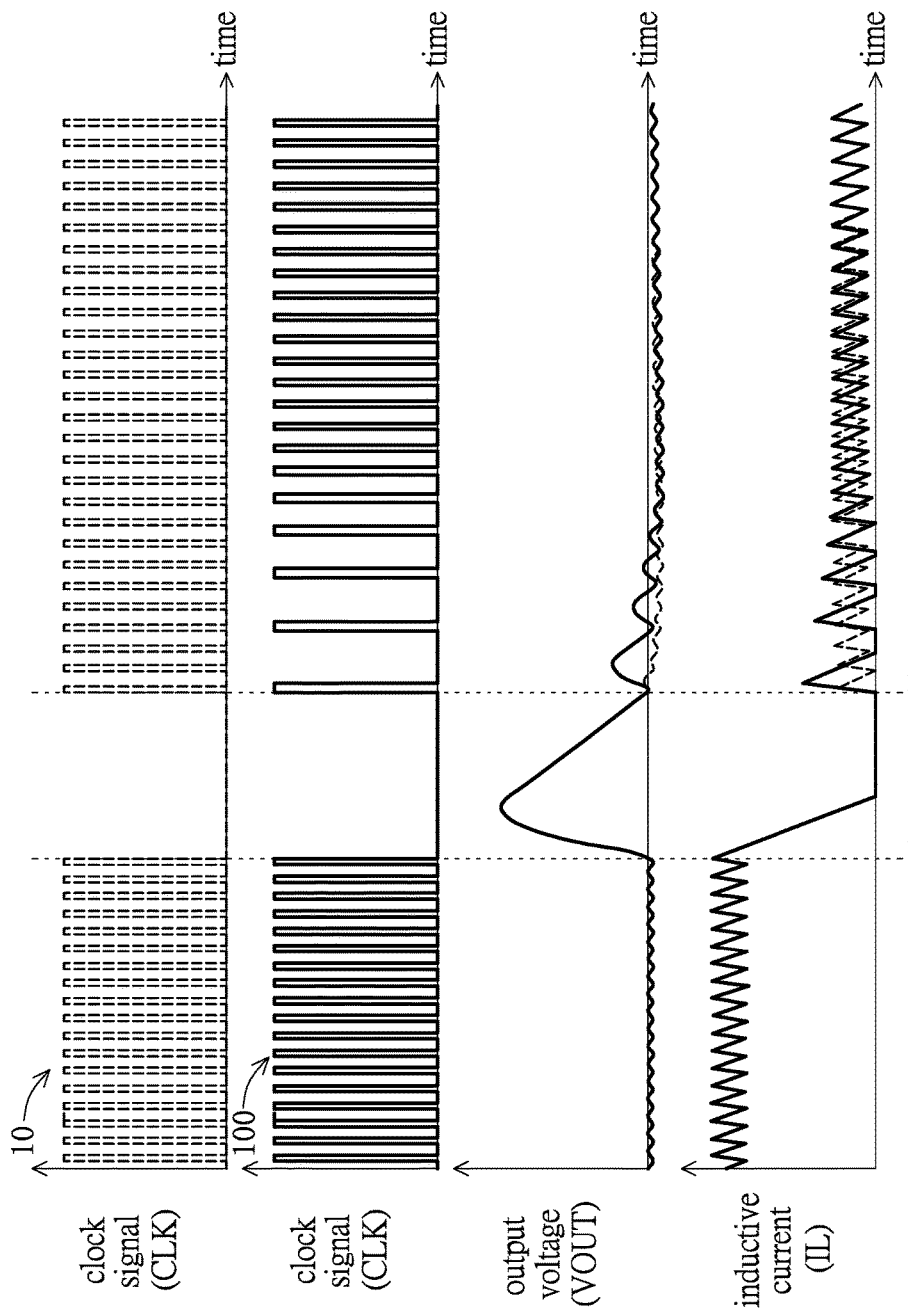
FIG. 7 shows another diagram of comparing the conventional constant on-time converter with the constant on-time converter of the present disclosure.

On condition that the load is converted from the heavy load to the light load, the comparison of the traditional constant on-time converter 10 (the dotted line) and the constant on-time converter 100 of the present disclosure (the active line) will be described in the following paragraph. As shown in FIG. 7, at time point T12, the load is converted from the heavy load to the light load. At time points T12-T13, the traditional on-time generator 16B and the on-time generator 140 of the present disclosure generates the longer off-time to rapidly decrease the current flowing through the inductor L, thereby decreasing the output voltage VOUT. After time point 13, the traditional output voltage VOUT and the output voltage VOUT of the present disclosure are stabilized to a voltage level. Therefore, in the architecture of the traditional constant on-time converter 10 and that of the constant on-time converter 100, their respective output voltages VOUT have the better transient response.

In summary, the present disclosure provides a constant on-time converter having fast transient response which adaptively adjusts the on-time of the clock signal by using the first compensation circuit and the second compensation circuit to accordingly adjust the inductive current, thereby enhancing the transient response of the output voltage.

The above-mentioned descriptions represent merely the exemplary embodiment of the present disclosure, without any intention to limit the scope of the present disclosure thereto. Various equivalent changes, alterations or modifications based on the claims of present disclosure are all consequently viewed as being embraced by the scope of the present disclosure.

What is claimed is:

1. A constant on-time converter having fast transient response, comprising:
   an output-stage circuit configured for outputting an output voltage according to an inductive current, and configured for generating a feedback voltage according to the output voltage;
   a first compensation circuit coupled to the output-stage circuit, configured for generating a first AC signal according to the feedback voltage and a reference voltage, generating a first DC signal according to the first AC signal, and comparing the first AC signal with the first DC signal to generate a set signal;
   a second compensation circuit coupled to the first compensation circuit, configured for receiving the first AC signal and generating a second AC signal and a second DC signal according to the first AC signal, wherein the second AC signal is related to an AC value of the first AC signal, and the second DC signal is related to a DC value of the first AC signal; and
   an on-time generator coupled between the first compensation circuit and the second compensation circuit, and configured for generating an on-time of a clock signal to the output-stage circuit according to the set signal, the second AC signal, and the second DC signal;
   wherein when the second AC signal is less than or equal to the second DC signal, the on-time generator increases the on-time of the clock signal and the output-stage circuit adjusts the inductive current according to the on-time.

2. The constant on-time converter according to claim 1, wherein when the second AC signal is more than the second DC signal, the on-time generator decreases the on-time of the clock signal to increase an off-time of the clock signal and the output-stage circuit adjusts the inductive current according to the off-time.

3. The constant on-time converter according to claim 2, wherein the first compensation circuit comprises:
   a first amplifier receiving the feedback voltage and the reference voltage and generating the first AC signal according to the feedback voltage and the reference voltage;
   a first filter coupled to the first amplifier and generating the first DC signal according to the first AC signal; and
   a comparator coupled among the first amplifier, the first filter, and the turn-on generator, and comparing the first AC signal with the first DC signal to generate the set signal;
   wherein when the feedback voltage is less than or equal to the reference voltage, the comparator generates the set signal with a first level and the on-time generator generates the on-time of the clock signal to the output-stage circuit according to the set signal with the first level.

4. The constant on-time converter according to claim 3, wherein the second compensation circuit comprises:
   a second amplifier having a positive end, a negative end, and an output end, wherein the positive end receives the first AC signal, the output end is coupled to the negative end and generates the second AC signal according to the first AC signal; and
   a second filter coupled to the output end and generates the second DC signal according to the second AC signal.

5. The constant on-time converter according to claim 1, wherein the output-stage circuit comprises:
   a switch circuit having a high-side switch and a low-side switch, wherein an end of the high-side switch receives an input voltage and the other end of the high-side switch connects to a ground by the low-side switch, and a connection end is provided between the high-side switch and the low-side switch;
   an inductor coupled to the connection end, and generating the output voltage according to the inductive current;
   a feedback circuit coupled to the inductor, and generating the feedback voltage according to the output voltage; and
   a driving circuit coupled between the turn-on generator and the switch circuit, and configured for controlling the high-side switch and the low-side switch according to the on-time to adjust the inductive current flowing through the high-side switch and the low-side switch;
   wherein when the on-time is at a first level, the driving circuit turns on the high-side switch and turns off the low-side switch;
   wherein when the on-time is at a second level, the driving circuit turns off the high-side switch and turns on the low-side switch.

6. The constant on-time converter according to claim 1, wherein the first compensation circuit comprises:
   a first amplifier receiving the feedback voltage and the reference voltage and generating the first AC signal according to the feedback voltage and the reference voltage;
   a first filter coupled to the first amplifier and generating the first DC signal according to the first AC signal; and
   a comparator coupled among the first amplifier, the first filter, and the turn-on generator, and comparing the first AC signal with the first DC signal to generate the set signal;
   wherein when the feedback voltage is less than or equal to the reference voltage, the comparator generates the set signal with a first level and the on-time generator generates the on-time of the clock signal to the output-stage circuit according to the set signal with the first level.

7. The constant on-time converter according to claim 6, wherein the second compensation circuit comprises:
   a second amplifier having a positive end, a negative end, and an output end, wherein the positive end receives the first AC signal, the output end is coupled to the negative end and generates the second AC signal according to the first AC signal; and
   a second filter coupled to the output end and generates the second DC signal according to the second AC signal.

8. The constant on-time converter according to claim 7, wherein the on-time generator comprises:
   a transconductance amplifier having a first end, a second end, and a transconductance output end and generates a transconductance current according to the second AC signal and the second DC signal, wherein the first end and the second end respectively receive the second AC signal and the second DC signal;
   an end of a clock capacitor coupled to the transconductance output end and a current source and the other end of the clock capacitor coupled to ground;
   an end of a clock switch coupled to the transconductance output end and the other end of the clock switch coupled to ground;

a latch coupled between the clock switch and the comparator, and turning on or turning off the clock switch according to the set signal and the on-time; and a clock comparator coupled to the transconductance output end, receiving the transconductance current and a current source current generated from the current source, and comparing a current relationship between the current source current and the transconductance current with a threshold voltage to generate the on-time to the driving circuit;

wherein when the second AC signal is less than or equal to the second DC signal, the latch delays to turn on the clock switch, the clock capacitor receives a difference value between the current source current and the transconductance current, and the current relationship is the difference value.

9. The constant on-time converter according to claim 8, wherein when the second AC signal is more than the second DC signal, the latch early turns on the clock switch, the clock capacitor receives a sum of the current source current and the transconductance current, and the current relationship is the sum.

10. The constant on-time converter according to claim 7, wherein the second filter is an RC filter, and the RC filter is composed of a plurality of resistors and a plurality of capacitors.

11. The constant on-time converter according to claim 1, wherein the second compensation circuit comprises:

a second amplifier having a positive end, a negative end, and an output end, wherein the positive end receives the first AC signal, the output end is coupled to the negative end and generates the second AC signal according to the first AC signal; and a second filter coupled to the output end and generates the second DC signal according to the second AC signal.

12. The constant on-time converter according to claim 1, wherein the on-time generator comprises:

a transconductance amplifier having a first end, a second end, and a transconductance output end and generates a transconductance current according to the second AC signal and the second DC signal, wherein the first end and the second end respectively receive the second AC signal and the second DC signal;

an end of a clock capacitor coupled to the transconductance output end and a current source and the other end of the clock capacitor coupled to ground;

an end of a clock switch coupled to the transconductance output end and the other end of the clock switch coupled to ground;

a latch coupled between the clock switch and the comparator, and turning on or turning off the clock switch according to the set signal and the on-time; and a clock comparator coupled to the transconductance output end, receiving the transconductance current and a current source current generated from the current source, and comparing a current relationship between the current source current and the transconductance current with a threshold voltage to generate the on-time to the driving circuit;

wherein when the second AC signal is less than or equal to the second DC signal, the latch delays to turn on the clock switch, the clock capacitor receives a difference value between the current source current and the transconductance current, and the current relationship is the difference value.

* * * * *